(12) United States Patent
Gallo et al.

(10) Patent No.: US 7,695,756 B2
(45) Date of Patent: *Apr. 13, 2010

(54) SYSTEMS, TOOLS AND METHODS FOR PRODUCTION OF MOLECULAR MEMORY

(75) Inventors: Antonio R. Gallo, Colorado Springs, CO (US); Werner G. Kuhr, Denver, CO (US)

(73) Assignee: ZettaCore, Inc., Englewood, CO (US)

( * ) Notice: Subject to any disclaimer, the term of this patent is extended or adjusted under 35 U.S.C. 154(b) by 1327 days.

This patent is subject to a terminal disclaimer.

(21) Appl. No.: 10/834,630

(22) Filed: Apr. 29, 2004

(65) Prior Publication Data

US 2005/0243597 A1    Nov. 3, 2005

(51) Int. Cl.
*B05D 5/12* (2006.01)

(52) U.S. Cl. .............. 427/58; 427/63; 427/79; 429/40; 429/149; 438/99; 365/151; 365/154

(58) Field of Classification Search ............. 427/58, 427/63, 79; 438/99; 365/151, 154; 429/40, 429/149
See application file for complete search history.

(56) References Cited

U.S. PATENT DOCUMENTS

| | | | |
|---|---|---|---|
| 5,650,061 A | 7/1997 | Kuhr et al. | |
| 5,883,397 A | 3/1999 | Isoda et al. | 257/40 |
| 5,923,525 A | 7/1999 | Belyakov et al. | |
| 5,926,412 A | 7/1999 | Evans, Jr. et al. | |
| 6,208,553 B1 | 3/2001 | Gryko et al. | |
| 6,212,093 B1 | 4/2001 | Lindsey | |
| 6,272,038 B1 * | 8/2001 | Clausen et al. | 365/151 |
| 6,290,839 B1 | 9/2001 | Kayyem et al. | |
| 6,324,091 B1 | 11/2001 | Gryko et al. | |
| 6,381,169 B1 | 4/2002 | Bocian et al. | |
| 6,451,942 B1 | 9/2002 | Li et al. | |
| 6,462,931 B1 | 10/2002 | Tang et al. | |
| 6,484,394 B1 | 11/2002 | Heo et al. | |
| 6,492,056 B1 | 12/2002 | Ovshinskey | |
| 6,642,376 B2 | 11/2003 | Lindsey et al. | |
| 6,657,884 B2 | 12/2003 | Bocian et al. | |
| 6,674,121 B2 | 1/2004 | Misra et al. | |

(Continued)

FOREIGN PATENT DOCUMENTS

WO     WO 01/03126 A2    1/2001

(Continued)

OTHER PUBLICATIONS

PCT/US 06/61522 Int'l Search Report and Written Opinion, Mar. 26, 2008.

(Continued)

*Primary Examiner*—Shamim Ahmed
(74) *Attorney, Agent, or Firm*—Morgan, Lewis & Bockius LLP

(57) ABSTRACT

A tool for manufacturing molecular electronic devices having a coating unit contained in a controlled ambient environment. The coating unit is coupled to a source of active device molecules in solution. The coating unit is configured to apply a selected quantity of the solution to a surface of a substrate and the process tool processes the coated substrate in conditions that cause the active device molecules to attach to active areas of the substrate.

8 Claims, 7 Drawing Sheets

U.S. PATENT DOCUMENTS

| | | | |
|---|---|---|---|
| 6,706,473 | B1 | 3/2004 | Edman et al. |
| 6,728,129 | B2 | 4/2004 | Lindsey et al. |
| 6,768,157 | B2 | 7/2004 | Krieger et al. |
| 6,777,516 | B2 | 8/2004 | Li et al. |
| 6,853,472 | B2 | 2/2005 | Warner et al. |
| 6,855,417 | B2 | 2/2005 | McCreery |
| 6,855,950 | B2 | 2/2005 | McCreery |
| 6,921,475 | B2 | 7/2005 | Kuhr et al. |
| 6,944,047 | B2 | 9/2005 | Rotenberg et al. |
| 6,958,270 | B2 | 10/2005 | Misra et al. |
| 7,005,237 | B2 | 2/2006 | Lindsey et al. |
| 7,019,391 | B2 | 3/2006 | Tranz |
| 7,032,277 | B2 | 4/2006 | Rolla et al. |
| 7,042,755 | B1 | 5/2006 | Bocian et al. |
| 7,061,791 | B2 | 6/2006 | Bocian et al. |
| 7,074,519 | B2 | 7/2006 | Kuhr et al. |
| 2001/0000492 | A1* | 4/2001 | Figura ........................ 438/256 |
| 2001/0010654 | A1 | 8/2001 | Shau |
| 2002/0004278 | A1* | 1/2002 | Gutsche ..................... 438/396 |
| 2002/0027802 | A1* | 3/2002 | Noble ........................ 365/154 |
| 2002/0105897 | A1 | 8/2002 | McCreery et al. |
| 2002/0158295 | A1 | 10/2002 | Armgarth et al. .......... 257/431 |
| 2002/0180446 | A1 | 12/2002 | Kuhr et al. |
| 2003/0081463 | A1 | 5/2003 | Bocian et al. |
| 2003/0082444 | A1 | 5/2003 | Kuhr et al. |
| 2004/0007758 | A1 | 1/2004 | McCreery |
| 2004/0115524 | A1 | 6/2004 | Misra et al. |
| 2004/0150465 | A1 | 8/2004 | Nishida et al. |
| 2004/0151912 | A1 | 8/2004 | McCreery |
| 2005/0041494 | A1 | 2/2005 | Bocian et al. |
| 2005/0194627 | A1 | 9/2005 | Nomoto et al. |
| 2005/0207208 | A1 | 9/2005 | Bocian et al. |
| 2005/0236654 | A1* | 10/2005 | Kijima et al. ............... 257/295 |
| 2005/0270820 | A1 | 12/2005 | Mobley et al. |

FOREIGN PATENT DOCUMENTS

| | | |
|---|---|---|
| WO | WO 02/077633 A1 | 10/2002 |
| WO | WO 03/052835 A1 | 6/2003 |
| WO | WO 03/071552 A | 8/2003 |

OTHER PUBLICATIONS

European Search Report for European Patent Application No. 05779254.1, Aug. 7, 2008.

Roth, K. M., Thesis published in 2002, Chapter I overview pp. 1-285.

Luyken, R. J., et al., "Concepts for hybrid CMOS-molecular non-volatile memories" Nanotechnology IOP Publishing UK., vol. 14, No. 2, 2003, pp. 273-276.

Kwok, K. S., "Materials for future electronics" *Materials Today, Elsevier Science*, Kidlington, GB, vol. 6, No. 12, Dec. 2003, pp. 20-27.

Gowda, et al., "Hybrid silicon/molecular memories-co-engineering for novel functionality" International Electron Devices Meeting 2003 IEDM. *Technical Digest.*, Washington, DC, Dec. 8-10, 2003, New York, NY: *IEEE*, US, pp. 537-540.

Roth K. M., et al. "Measurements of Electron-Transfer Rates of Charge-Storage Molecular Monolayers on Si(100). Toward Molecular/Semiconductor Information Storage Devices", J. Am. Chem. Soc.; *Journal of the American Chemical Society* Jan. 15, 2003, vol. 125, No. 2, Jan. 15, 2003, pp. 505-517.

Gittins, et al., "A nonmetre-scale electronic switch consisting of a metal cluster and redox-addressable groups" Nature, *MacMillan Journals, Ltd.*, London, GB, vol. 408, Nov. 2, 2000, pp. 67-69.

Nishida Y., et al. "An Interpolating Sense Circuit for Molecular Memory", *Department of Electrical and Computer Engineering, CICC 2002*, 4 pp.

Schweikart, K-H, et al., "Design, synthesis, and characterization of prototypical multistate counters in three distinct architectures", *J. Mater. Chem.*, 2002, 12(4), pp. 808-828.

Ccc™ Spincoaters, Brewer Science, http://www.brewerscience.com/cee/products/cee100.html, 8 pp.

"Bake Process Theory", *Cost Effective Equipment*, (no date), 4 pp.

MBraun, Inertgas Technology, MB OX-SE-3 Oxygen Probe, (no date), www.mbraun.com, 4 pp.

"Spin Coat Theory", Cost Effective Equipment, (no date), 6 pp.

"Spin Coating Patent Index", http://www.mse.arizona.edu/faculty/birnie/Coatings/PatenNdx.htm, Apr. 12, 2005, 10 pp.

Primaxx website pages, http://www.primaxxinc.com/products.html, Apr. 12, 2005, 30 pp.

P. Mumbauer, et al. "Mist Deposition in Semiconductor Device Manufacturing", Nov. 1, 2004, http://www.reed-electronics.com/semiconductor/index.asp?layout=articlePrint&articleID=CA476..., 7 pp.

Xiangfeng D., et al. "Nonvolatile Memory and Programmable Logic from Molecule-Gated Nanowires", *Nanoletters* 2(5) (2002), pp. 487-490.

Li, C., et al. "Data Storage Studies on Nanowire Transistors with Self-Assembled Porphyrin Molecules", *J. Phys. Chem. B. 2004*, 108, pp. 9646-9649.

Roth K. M., et al. "Molecular Approach Toward Information Storage Based on the Redox Properties of Porphyrins in Self-Assembled Monolayers", *J. Vac. Sci. Tech. B 2000*, 18, pp. 2359-2364.

Gryko, D., et al., "Synthesis of "Porphyrin-Linker-Thiol", Molecules with Diverse Linkers for Studies of Molecular-Based Information Storage", *J.Org. Chem. 2000*, 65, pp. 7345-7355.

Gryko, D., et al., "Synthesis of Thiol-Derivatized Ferrocene-Porphyrins for Studies of Multibit Information Storage", *J. Org. Chem. 2000*, 65, pp. 7356-7362.

Clausen C.,et al., "Synthesis of Thiol-Derivatized Porphyrin Dimers and Trimers for Studies of Architectural Effects on Multibit Information Storage", *J. Org. Chem. 2000*, 65, pp. 7363-7370.

Clausen C., et al., "Investigation of Tightly Coupled Porphyrin Arrays Comprised of Identical Monomers for Multibit Information Storage," *J.Org. Chem. 2000*,65, pp. 7371-7378.

Li J., "Synthesis of Thiol-Derivatized Europian Porphyrinic Triple-Decker Sandwich Complexes for Multibit Molecular Information Storage", *J. Org. Chem. 2000*, 65, pp. 7379-7390.

Gryko D. et al., "Thiol-Derivatized Porphyrins for Attachment to Electoactive Surfaces", *J. Org. Chem. 1999*,64, pp. 8635-8647.

Gryko, D. "Studies Related to the Design and Synthesis of a Molecular Octal Counter", *J. Mat. Chem.*, 2001, 11(4), pp. 1162-1180.

Roth K. M., et al., Characterization of Charge Storage in Redox SAMs, *Langmuir*, 2002, 18(10): pp. 4030-4040.

Roth K. M., et al., "Comparison of Electron-Transfer and Charge-Retention Characteristics of Porphyrin-Containing Self-Assembled Monolayers Designed for Molecular Information Storage", *J. Phys. Chem. B.*, 2002, 106, pp. 8639-8648.

Liu, Z., et al., "Molecular Memories That Survive Silicon Device Processing and Real-World Operation", *Science* vol. 302, Nov. 28, 2003, pp. 1543-1545.

Roth K. M., "Charge-Retention Characteristics of Self-Assembled Monolayers of Molecular-Wire-Linked Porphyrins on Gold", *American Chemical Society*, 2003, pp. 51-61.

Seth et al. "*Investigation of Electronic Communication in Multi-Porphyrin Light-Harvesting Arrays*", (1994) *J. Am. Chem. Soc.*, 116: pp. 10578-10592.

Seth et al *Soluble Synthetic Multiporphyrin Arrays. 3. Static Spectroscopic and Electrochemical Probes of Electronic Communication*, (1996), *J. Am. Chem. Soc.*, 118: pp. 11194-11207.

Strachan et al. "*Effects of Orbital Ordering on Electronic Communication in Multiporphyrin Arrays*" (1997), *J. Am. Chem. Soc.*, 119: pp. 11191-11201.

Li et al. "*Effects of Central Metal ion (Mg, Zn) and Solvent on Singlet Excited-State Energy Flow in Porphyrin-Based Nanostructures*", (1997), *J. Mater. Chem.*, 7: pp. 1245-1262.

Strachan et al. "*Synthesis and Characterization of Tetrachlorodiarylethyne-Linked Porphyrin Dimers. Effects of Liner Architecture on Intradimer Electronic Communication*" (1998), *Inorg. Chem.*, 37: pp. 1191-1201.

Yang et al. *Interplay of Orbital Tuning and Linker Location in Controlling Electronic Communication in Porphyrin Arrays*"(1999)", *J. Am. Chem. Soc.*, 121: pp. 4008-4018.

Roth et al. *Molecular Approach Toward Information Storage Based on the Redox Properties of Porphyrins in Self-Assembled Monolayers*, (2000) *Vac. Sci. Technol. B* 18: pp. 2359-2364.

Roth et al. "*Measurements of Electron-Transfer Rates of Charge-Storage Molecular Monolayers on Si(100). Toward Hybrid Molecular/Semiconductor Information Storage Devices*" (2003), *J. Am. Chem. Soc.* 125: pp. 505-517.

Advanced Inorganic Chemistry, 5th Ed., Cotton & Wilkinson, John Wiley & Sons, 1988, chapter 26.

Advanced Organic Chemistry, 5th Edition, Cotton & Wilkenson, John Wiley & Sons, 1988, p. 38.

Organometallics, A Concise Introduction, Elschenbroich et al., 2nd Ed., 1992, VCH.

Comprehensive Organometallic Chemistry II, A Review of the Literature 1982-1994, Abel et al. Ed., vol. 7, Chapters 7, 8, 10 & 11, Pergamon Press.

Robbins et al., "Syntheses and Electronic Structures of Decamethylmetallocenes", (1982), *J. Am. Chem. Soc.* 104: pp. 1882-1893.

Gassman et al., "(Trifluoromethyl) cyclopentadienide: A Powerful Electon-Withdrawing Ligand for Transition-Metal Complexes", (1986), *J. Am. Chem. Soc. 108*: pp. 4228-4229.

Connelly et al., "Chemical Redox Agents for Organometallic Chemistry", *Chem. Rev.* (1996) 96: pp. 877-910.

Geiger et al., "The Electron-Transfer Reactions of Polynuclear Organotransition Metal Complexes", Advances in Organometallic Chemistry 24: p. 87-130.

Jiang et al. "Double-decker Yttrium(III) Complexes with Phthalocyaninato and Porphyrinato Ligands", J. Porphyrins Phthalocyanines (1999) 3: pp. 322-328.

Arnold et al. "Mixed Phthalocyaninato-Porphyrinato Europium(III) Triple-decker Sandwich Complexes Containing a Conjugated Dimeric Porphyrin Ligand", Chemistry Letters (1999), pp. 483-484.

\* cited by examiner

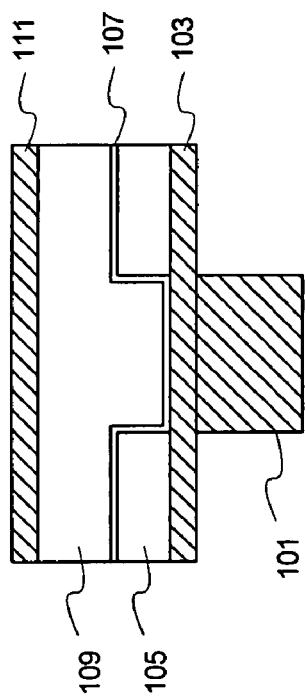
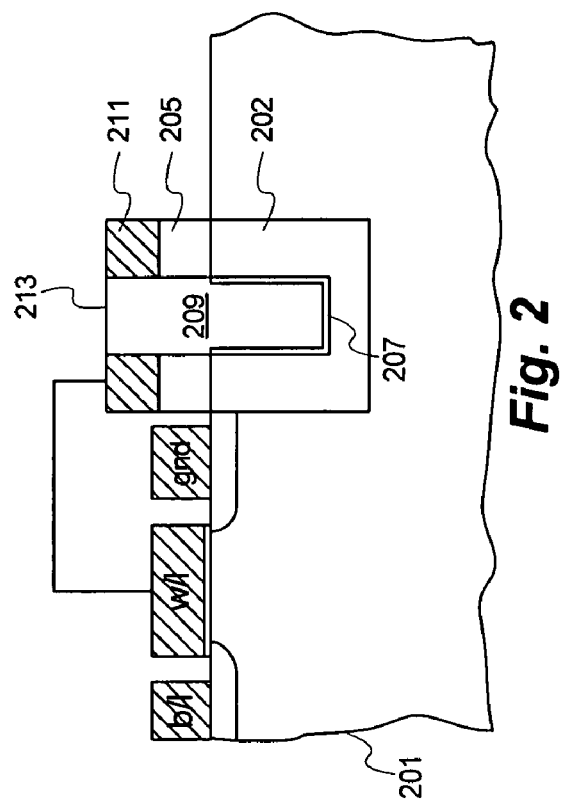

SYSTEMS, TOOLS AND METHODS FOR PRODUCTION OF MOLECULAR MEMORY

CROSS-REFERENCE TO RELATED APPLICATIONS

The present invention relates, in general, to the subject matter of co-pending patent application Ser. No. 10/766,304 entitled: "Molecular Memory Arrays and Devices" assigned to Zettacore, Inc., 2000 S. Colorado Blvd., Suite 10000, Denver, Colo. 80222, assignee of the present invention, the disclosure of which is herein incorporated by this reference in its entirety.

BACKGROUND OF THE INVENTION

1. Field of the Invention

This invention relates to processing methods for memory devices, such as dynamic random access memory. In particular, this invention relates to processing methods that leverage tools and techniques available in the semiconductor industry for the production of molecular memory cells, molecular memory arrays, and electronic devices including molecular memory.

2. Relevant Background

Conventional CPUs, memory devices and data communication mechanisms are mass produced as solid state electronic devices. Although sometimes referred to as "semiconductor devices", solid state electronic devices rely on electrical behavior of solid materials including metals, semiconductors, and insulators. The techniques and equipment for producing solid state devices have improved dramatically over time to enable the production of devices such as switches, capacitors, resistors, and interconnections with sub-micron scale features at higher yields and lower cost.

Advances in semiconductor processing and device design have resulted in memory devices, for example, that implement hundreds of megabits of storage on a single integrated circuit. Such devices include volatile memory such as dynamic random access memory (DRAM) and static random access memory (SRAM), and non-volatile memory such as electrically erasable programmable read only memory (EEPROM), Flash RAM, ferroelectric DRAM, and the like. Memory manufacturing processes continue to push the limits of fine-geometry patterning and machining technology.

However, physical limitations on the materials and tools used to manufacture solid state electronic devices will not always support making smaller and smaller devices. Even where smaller geometries can be implemented, device performance may suffer. For example, memory devices with smaller storage capacitors require more frequent refreshing so that the power and time consumed by refresh processes limit overall device performance and can also increase soft error rates. Moreover, the capital and intellectual investment required to continue improving materials, processes and tools so that smaller geometry components can be manufactured is a burden on future development in the solid state manufacturing industries. As a result, alternative technologies for manufacturing computing devices and particularly memory devices are being considered.

Another problem facing memory designers trying to increase information density (e.g., the amount of information that can be stored in a given area of the memory chip) is that each memory cell of a conventional solid state capacitor can only store one bit of information. Accordingly, it would be desirable to have processes for manufacturing memory devices with improved information storage density achieved by having a memory cell that can reliably store a plurality of discrete states.

One area of investigation includes molecular devices that implement some or all components of an electronic device or system with molecular scale structures and components. These molecular scale structures and components exhibit molecular rather than solid state behavior, which can provide enhanced performance in many instances. Moreover, because molecules retain their essential properties down to the individual molecule level, molecular-scale components and device structure can be scaled (or shrunk) as future processing tools and technology are developed.

The approach of using molecules in electronic devices such as switches, capacitors, conductors and the like, depends on the development of attachment chemistries and processes to achieve high yield at reasonable throughputs and costs. Because current technology relies on physical patterning of device structures, chemical approaches to electronic device manufacture have not been used in production environments. To be certain, existing processes in the semiconductor industry rely heavily on a variety of chemical processes, however, these chemical processes are used to deposit, etch, shape, clean and modify materials that make up the devices. The chemicals themselves are rarely left on the finished device, except as contaminants, and are not used to form active device structures.

As such, equipment vendors and tool development engineers have not designed process tools to apply efficient attachment chemistries that can be used in molecular electronic device manufacture. Molecular scale components require repeatable processes that are able to attach desired chemical species to substrates, other device structures, and each other. Robust processes for forming molecular structures enable new types of components such as electrochemical cells to be implemented with semiconductor devices.

While it is desirable for molecular manufacturing techniques to be compatible with existing semiconductor industry processes and to use existing semiconductor industry tools, molecular device structures are sensitive to many variables and conditions that do not trouble semiconductor processes. For example, water is present throughout most semiconductor manufacturing processes as a cleaning fluid and in the form of ambient humidity. However, water can have destructive effects on some molecular processes as water molecules interfere with the attachment chemistry or destroy the active molecules. Similarly, thin native oxide layers and ultra-low contaminant levels are tolerable in semiconductor processes because the bulk effects of these aberrant features are minimal in comparison to the overall device function. In contrast, when devices are manufactured with molecular-scale features, these molecular-scale defects can become significant.

In view of the above, it is apparent that a need exists for processes for manufacturing molecular memory cells, molecular memory arrays, and electronic devices including molecular memory. Further, there is a need for molecular memory devices that can be manufactured using techniques that are compatible with existing semiconductor manufacturing practices so that semiconductor devices and interconnections can be manufactured monolithically with molecular memory devices.

SUMMARY OF THE INVENTION

Briefly stated, an embodiment of the present invention comprises a tool for manufacturing molecular electronic devices having a coating unit contained in a controlled ambient environment. The coating unit is coupled to a source of active device molecules in solution or in a gaseous or solid form as well. The coating unit is configured to apply a selected quantity of the solution to a surface of a substrate and the process tool processes the coated substrate in conditions that cause the active device molecules to attach to active areas of the substrate.

Additional novel features are set forth in the description that follows, and in part will become apparent to those skilled in the art upon examination of the following specification or may be learned by the practice of the invention. The features and advantages of the invention may be realized and attained by means of the instrumentalities, combinations, and methods particularly pointed out in the appended claims.

BRIEF DESCRIPTION OF THE DRAWINGS

FIG. 1 shows a simplified cross-section of a stacked embodiment molecular electronic device;

FIG. 2 shows a simplified cross-section of a "molehole" embodiment molecular electronic device;

DETAILED DESCRIPTION OF THE PREFERRED EMBODIMENTS

Figure 4:
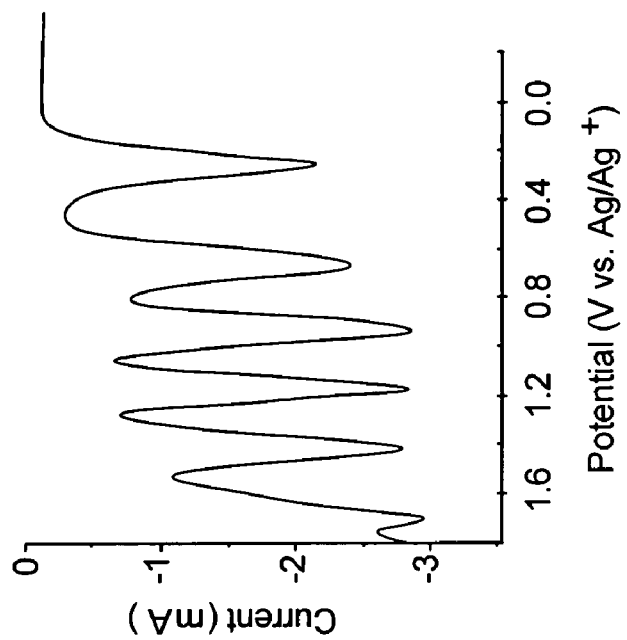
FIG. 4 illustrates a current-voltage characteristic of a second exemplary molecular electronic device in accordance with the present invention.

The present invention generally relates to processes for manufacturing molecular electronic devices and techniques for adapting existing semiconductor manufacturing tools and processes for compatibility with molecular electronics fabrication. The semiconductor industry has made a significant investment in design and improvement of manufacturing tools. These tools and associated processing techniques are designed to fabricate electronic devices including discrete devices, integrated circuits, and system-on-chip type devices based on the bulk material properties of metals, ceramics, glasses and semiconductors that are used for conventional devices. Hence, they are not suitable in many cases for the demands of molecular device fabrication. Although it is contemplated that special purpose tools and techniques will evolve over the coming decades for use with molecular device fabrication, there is a significant benefit in adapting current technology in a manner that enables existing tools to be used to reliably fabricate molecular devices.

The present invention is described particularly with respect to molecular memory devices that implement charge storage using molecular storage devices. Memory devices have been manufactured and demonstrate many of the useful features of the present invention. However, the teachings of the present invention are readily applied to a wide variety of molecular electronic devices including molecular switches, molecular logic, molecular data processors, and the like. Accordingly, it is contemplated that one can readily adapt the specific teachings and examples to the manufacture of a wide variety of devices in which some or all of the device components include molecular-scale structures.

FIG. 1 shows a stacked configuration for construction of a molecular charge storage device while FIG. 2 illustrates a trench or "molehole" implementation. In the stacked implementation of FIG. 1, the entire structure may be built on top of and electrically coupled to an electrode or bond pad of an underlying semiconductor device. For example, conductive via or plug 101 may reach down through passivation and planarization layers of a semiconductor device to make electrical contact with a source/drain region of an access transistor (not shown) or other active device. Conductive plug 101 may couple to a metal bond pad, or to the active region of a semiconductor device. In a particular example, plug 101 comprises tungsten, but may be manufactured using any metal, alloy, silicide, or other material that is available for implementing electrical connectivity.

Working electrode 103 may comprise, for example, aluminum, gold, silver, tungsten or other available conductor, and while preferably a metal, may also comprise a semi-metal such as titanium nitride or also polysilicon. Working electrode 103 is preferably formed at the same time as other structures such as bond pads and interconnects for an integrated circuit. Processes and materials for forming plugs 101 and electrodes 103 are widely available in the semiconductor processing industry. In many integrated circuit processes, metal pads will be coated with insulating layer 105 which serves to protect and/or passivate working electrode 103. Insulating layer 105 may be implemented as a deposited oxide, silicon nitride, or the like. Layer 105 is patterned to expose a portion of working electrode 103, which may, in certain processes, be performed in the same operation used to expose portions of bonding pads of the integrated circuit. The exposed portion of working electrode 103 defines an "active area" for the attachment of storage molecules. It is contemplated that the present invention can be manufactured up through the formation and patterning of oxide 105 using industry standard process flows.

A thin layer 107 of storage molecules is formed on the active area of working electrode 103 and becomes attached and electrically coupled thereto. Layer 107 may range in thickness from 1 to 100 nanometers in particular examples. While in some particular embodiments it may be desirable to implement layer 107 as a self assembling monolayer (SAM), it may also be formed by, for example, selective deposition or other suitable processes. The attachment site for the molecules may be lithographically defined by patterning layer 105 over the conductive material as indicated. As a representative example only, an extensive library of thiol-derivatized porphyrins (~150 compounds) is available as potential storage molecules for attachment to gold electrodes suitable for use in layer 107. Presently, these compounds comprise five different architectures: (1) monomeric porphyrins with different types of tethers, (2) ferrocene-derivatized porphyrins, (3) wing-shaped trimeric porphyrins, (4) directly linked dimeric and trimeric porphyrins, and (5) triple-decker sandwich porphyrins. All of these porphyrinic architectures have been found to form excellent quality self-assembled monolayers (SAMs).

Once the molecules are attached, a thin (e.g., 50 to 200 nanometer) layer of conductive gel is applied to form electrolyte 109. Electrolyte 109 is the electrolyte for the oxidation-reduction cell. A metal layer 111 is deposited by evaporation, sputtering, or other deposition technique on to electrolyte layer 109. Metal layer 111 forms a reference electrode or counter electrode of the oxidation-reduction cell and, for example, may comprise any well-behaved electrochemical counter electrode material such as copper, silver, platinum and the like. Economics and semiconductor processes already developed will determine the metal of choice in a particular application.

The electrolyte 109, which may be a liquid, gel, or solid, should be chemically compatible with the storage molecules and other conductors and insulators used in the device. Electrolyte 109 enables the ionic transport of charge between the working and reference electrodes. For any given oxidation state and choice of storage molecules, the electrochemical cell exhibits a distinctive electrochemical potential called the open circuit potential (OCP) or equilibrium potential. A given molecular storage device will have two, three, four, or more distinctive OCPs depending on the particular storage molecules chosen. This offers the potential of manufacturing molecular electronic devices that processes data in multiple states rather than the binary processing familiar to solid state electronic devices. While some adjustment of the electronics will be required to compensate for the particular characteristics of the chosen storage molecule, however, the manufacturing advantages are clear.

One advantage of the stacked architecture shown in FIG. 1 is that the bottom surface of the molecular storage device forms the electrode surface and storage molecules are able to form monolayers on this surface. Also, electrolyte layer 109 coats the storage molecules, essentially encapsulating them and protecting them from subsequent steps. Moreover, metal may, or may not, be deposited directly onto the molecular layer, thereby in the latter instance preventing damage and other problems associated with architectures that expose the storage molecules during or after processing to metal contamination. Further, the structure of FIG. 1 provides an easy way to implement a three-dimensional architecture in that subsequent layers of metal, insulator and the like are added after manufacture of the underlying semiconductor-based microelectronic devices.

FIG. 2 illustrates an alternative implementation of a molecular storage device in which an electrochemical cell is formed in a trench structure, also called a "molehole" structure. A trench extends into substrate 201, through an overlying dielectric layer 205 (e.g., oxide) and counter electrode 211. The walls of the trench are exposed and provide a surface contact to which storage molecules 207 can be attached or otherwise assembled. Storage molecules 207 and electrolyte 209 are added and the structure can then be covered by a polymer 213 (or an insulator such as SiN, $SiO_x$ and the like) to seal the array.

Utilizing the systems, tools and methods of the present invention, the trench architecture shown in FIG. 2 can be formed in a manner that avoids the possibility of metal being deposited onto the molecular layer, thereby preventing damage and other problems associated with other proposed architectures. The inside of the trench forms the electrode surface, and molecules form SAMs on the inside of the cylinder, hence, the number of molecules can be increased by increasing the depth of the trench. The height of each layer of metal determines the height of the trench, thereby allowing easy adjustment of the effective area of the two terminals. Because the vertical dimension is used, many more molecules are available. This allows greatly enhanced sensitivity for a given cross-sectional area. In addition, the design of FIG. 2 easily accomplishes any variation in the relative sizes of each electrode. The effective capacitance of each junction is diminished by the removal of a large area of dielectric between the two metal plates at each intersection.

Figure 3:
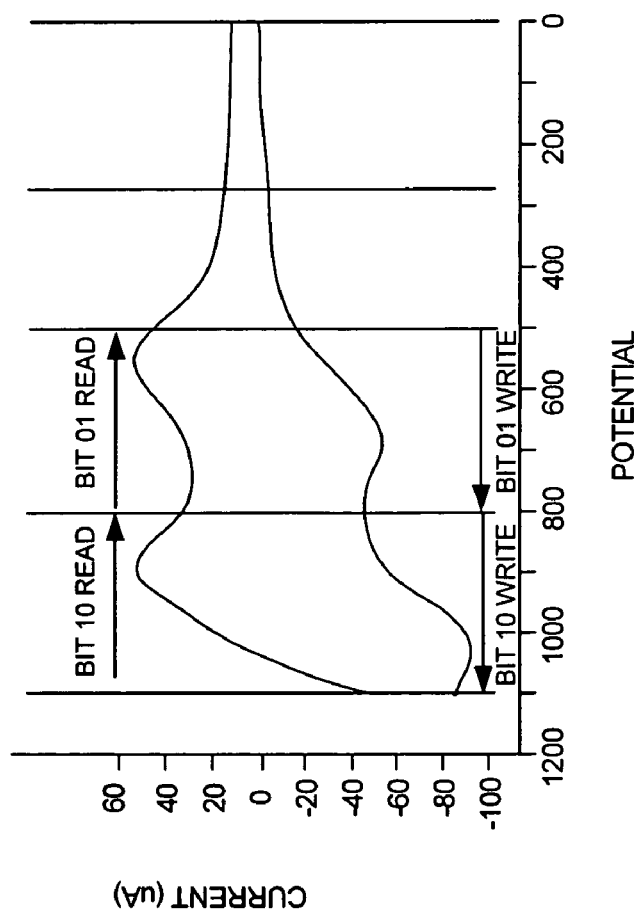
FIG. 3 illustrates a current-voltage characteristic of a first exemplary molecular electronic device in accordance with the present invention.

FIG. 3 is an exemplary cyclic voltammogram that illustrates a current-voltage characteristic of a two-state monomeric porphyrin molecule wherein the two peaks correspond to two distinct oxidization states. Each oxidation state can be set or written to independently of the other. A voltage is applied to create the desired oxidation state of the storage molecules. Typically, this voltage will be somewhat above the open circuit potential of the storage molecules to compensate for resistive and capacitive losses in the writing circuitry. In a specific embodiment, the working electrode 102/202 is held at a ground potential and the reference electrode 111/211 is placed at a bias potential slightly below a peak in the IV curve shown in FIG. 3.

FIG. 4 illustrates a storage molecule having five discernable oxidation states, each indicated by a peak in the CV curve shown in FIG. 5. Molecular storage promises great expansion in information density because storage molecules can be designed with almost any number of distinct oxidation states. As each oxidation state is capable of storing one bit of information, the information density of a memory array increases dramatically. Similarly, the switches may be implemented with multiple activation states, rather than just on or off.

Preferably the active device molecules are attached using self-assembling processes. Self-assembly generally refers to processes that match surface characteristics of a device substrate or structure with attachment properties of molecules. This is accomplished by manipulating the surface properties of the substrate and/or device structures so that the active device molecules will naturally tend to attach in a desired fashion. Self-assembly allows the molecules to attach selectively to a particular type of surface (for example, gold, silicon, various metals and oxides), which can avoid masking and patterning operations. Further, self assembly processes can encourage the active device molecules to pack tightly on that surface, and to align in a desired manner on the surface so that the molecules exhibit one or more desired behaviors.

An important advantage of self-assembling processes is that devices with molecular scale features and components can be manufactured using tools and equipment that is designed for much larger dimensions. Molecules can be applied using batch processes to an entire wafer by spin-coating, spraying, gas-phase coating, and/or dipping and will attach to only those surfaces for which they are designed. Unattached molecules are simply washed away from the other "inactive" surfaces. In this manner semiconductor tools for coating, etching and photo-patterning can be used to define larger structures than the molecular devices while self-assembling processes are used to define the molecular-scale features.

Figure 5A:
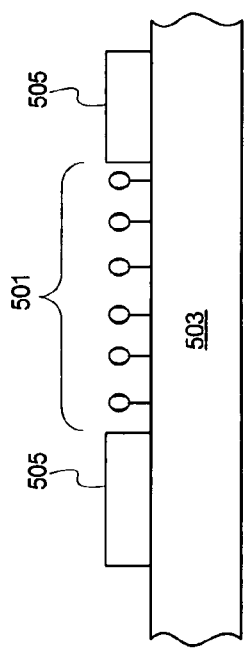
FIG. 5a through FIG. 5d illustrate a portion of a molecular electronic device at various stages of processing.

FIGS. 5*a* through FIG. 5*d* illustrate a portion of a process flow used to attach active device molecules such as thiol-derivatized porphyrins to a device structure. In FIG. 5*a*, an active area 501 has been defined using micron or sub-micron scale technology such as photolithography, self-aligned etching, and the like. A first device component 503 comprises a type of material to which active devices molecules (e.g., porphyrins) will attach in a subsequent self-assembly process. A second device component 505 comprises a type of material to which active device molecules will not attach.

Figure 5B:
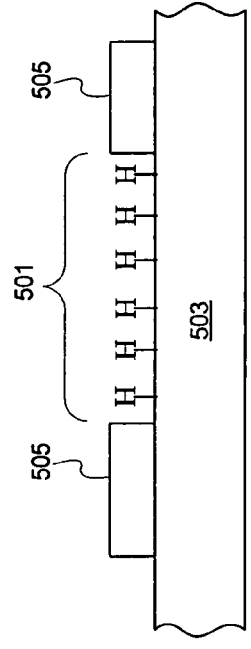

In FIG. 5*a*, the active area 501 includes a plurality of attachment sites which are oxidized to form a thin oxide layer. This oxide layer may be a native oxide formed when the surface of material 503 is exposed to oxygen. The oxygen atoms bond to the potential attachment sites which will prevent or inhibit bonding of active device molecules. As shown in FIG. 5b, the active area 501 is treated in a passivation process to replace some or all of the oxygen atoms with hydrogen atoms. Passivation might be accomplished by soaking substrates in a hydrogen or forming gas atmosphere at a moderate temperature for a period of time sufficient to displace the oxygen with hydrogen.

It is significant to note that a typical surface will present a relatively small number of potential attachment sites as compared to the total number of molecules at the surface within the active area 501. This means that an active area will likely comprise a much larger number of inactive molecules than active device molecules. Accordingly, all of the processes used in the attachment of active device molecules may be optimized to yield high attachment rates and low contamination. Contaminants include any species that interfere with attachment and/or have a non-beneficial behavior in the molecular electronic device.

The passivated surface in FIG. 5b may be activated by exposure to heat, light, radiation, and/or other available surface activation means. The "X" designations in FIG. 5c indicate activated attachment sites. Activation may involve the use of rapid thermal processing techniques used in the semiconductor industry. Activation serves to remove the hydrogen atoms attached to the attachment sites and leave the sites in a state that will readily bond to an active device molecule. Activation may be performed in an inert environment such as ultrapure argon, nitrogen, a vacuum and the like. In some cases activation may be unnecessary as when the active device molecules have sufficient innate attachment strength to displace the hydrogen directly.

Figure 5C:
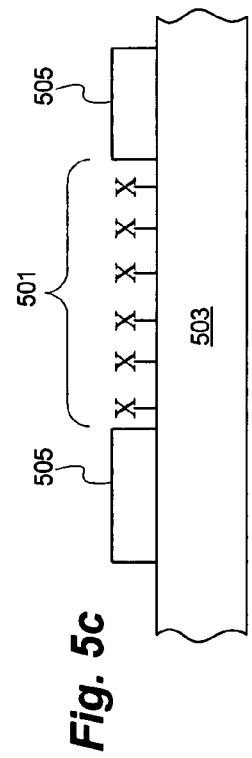
Figure 5D:
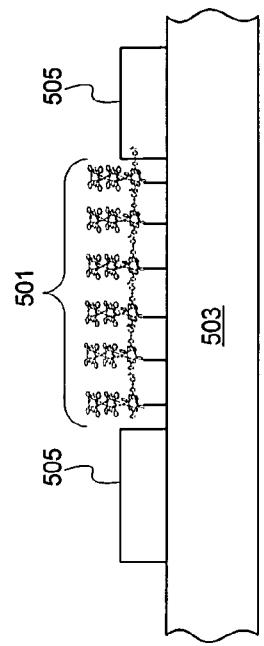

The activated surface of FIG. 5c or the passivated surface of FIG. 5b is coated with a solution containing the active device molecules. In a specific embodiment, the solution comprises alcohol-linked porphyrin molecules that are applied by spin coating, spray coating, vapor phase coating, or similar process. The active area may be exposed to heat, electromagnetic energy, radiation, or other actinic energy to encourage attachment of the active device molecules.

To inhibit deactivation of the activated surface, the atmosphere of the processing environment before during and after the chemical attachment processes is carefully controlled. Although a conventional photoresist or HMDS spin coating tool may be used to apply the active device molecule solution, the tool is modified to enclose the workpiece in what may be a low humidity environment that is substantially free of chemical species that would bond to attachment locations. These species include hydrogen, oxygen, most metal atoms, and water, although the particular species that must be filtered will vary in each application in a predictable manner based on the particular active device molecules and materials being used.

Figure 6:
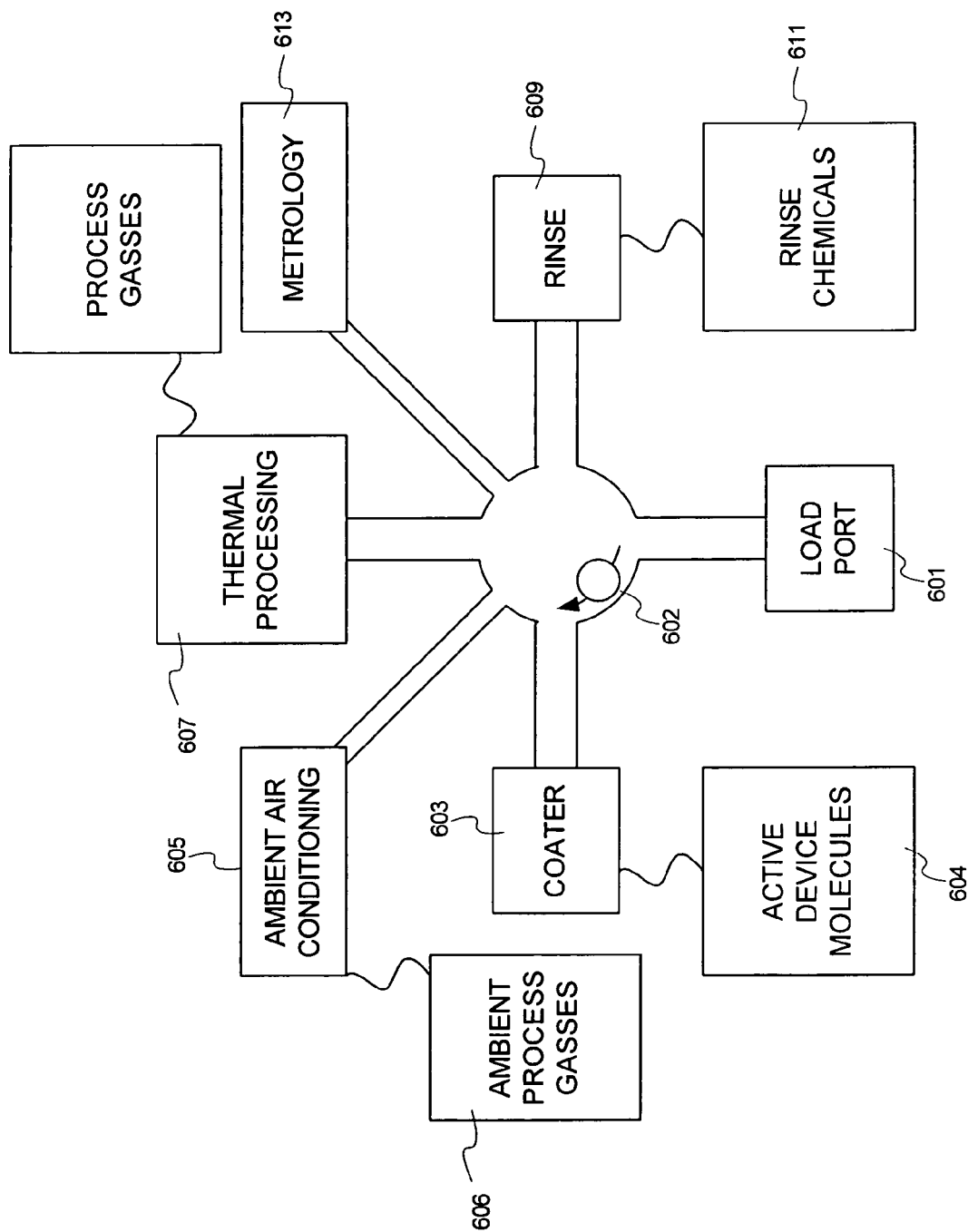
FIG. 6 schematically illustrates a molecular attachment processing tool in accordance with the present invention.

FIG. 6 illustrates an exemplary molecular device processing tool contemplated by the present invention. The processing tool shown in FIG. 6 illustrates an integrated processing tool having multiple functional modules coupled by robotic substrate transport mechanisms. An integrated tool approach allows the ambient environment to be carefully monitored and regulated to control contaminant levels, humidity levels, temperature, and the like. For example, ambient air conditioning unit 605 desirably comprises dehumidification to maintain a constant low humidity level, temperature controls, mechanical, chemical and/or electrofiltration to remove particles above about 0.3 micrometers or less. Optionally, ambient air conditioning 605 may use desiccants and particle agglomeration mechanisms to further improve and control ambient environmental conditions.

The configuration and arrangement of processing modules of the integrated tool in FIG. 6 is for purposes of illustration only as any available tool configuration may be used. Alternatively, process modules may be provided separately in a non-integrated environment with multiple independent processing stations. A non-integrated tool may require that each of the tools be placed in a similarly controlled environment and that the transport between process locations be performed using sealed, environmentally controlled carriers.

The apparatus of FIG. 6 is specifically adapted to support processes for attaching active device molecules. These processes are particularly well suited for integrated processing because, unlike many semiconductor processes, they can be performed sequentially without requiring a photo-patterning step. Photo-patterning is one of the more difficult processes to integrate because of the bulky specialized equipment involved as well as the frequency with which human intervention is required to operate and maintain the equipment. Accordingly, it is contemplated that a molecular manufacturing tool may integrate even more processes than is practical in semiconductor manufacturing tools.

In the tool shown in FIG. 6, partially processed substrates enter the tool through load chamber 601 which serves as an air lock to protect the internal ambient environment within the tool. Substrates may be loaded one at a time or in batches. Substrates are processed through the patterning processes that expose and activate active areas 501. Alternatively, the passivation and activation steps described in reference to FIG. 5A through FIG. 5D may be integrated into the tool shown in FIG. 6.

Transport mechanism 602 moves substrates between process modules as well as into and out of process modules. Coater 603 comprises a spin coating module in a particular implementation, although sprayers, vapor coaters, dipping and the like may be used in particular applications. In a particular implementation of the present invention, the coater 603 may be coupled to a supply 604 of a solution containing active device molecules, although other mechanisms such as vapor deposition can be used to dispense the active molecules. As stated previously, the coater 603 may be maintained in a low humidity, ultrapure environment maintained by air conditioning systems 605 and ambient gasses 606 to prevent contamination of the active area 501 although other equipment also lends itself to environmental control for etching operations, chemical vapor deposition processes and the like. It is desirable in many applications to provide fresh chemicals from supply 604 for each substrate being coated. This avoids depletion of the chemicals and lowers the risks of contamination associated with reusing chemicals.

Once coated, substrates are transported by transport mechanism 602 to a thermal process module 607. Thermal process module 607 provides heating and/or cooling using hot plates, convection heaters, microwave heaters, or other available thermal control system. The attachment reaction kinetics of self-assembly attachment processes are often affected by temperature such that the attachment efficiency is increased, process time reduced, and/or attachment quality improved by allowing the attachment processes to occur over a period of time at temperature. The temperature may be constant or may be varied over time according to a programmed profile to meet the needs of a particular application. By way of specific example, substrates may be maintained at 400 degrees Celsius for a period of two minutes when alcohol linked porphyrins are used as the active device molecules. Thermal processing also serves to drive off solvents that may be used in the solution carrying the active device molecules. Thermal processing module 607 may also cool substrates after processing at elevated temperatures before the substrates are transferred to a subsequent module.

Transfer mechanisms 602 transfer substrates from thermal processing 607 to rinse module 609. Rinse module 609 comprises a spin rinser in a particular implementation that sprays a rinsing solution from supply 611 onto the substrate surface while the substrate spins. The rinsing solution comprises, for example, solvents such as dimethyl formadide or acetonitride and the like. The rinsing solution is selected to remove active device molecules that did not attach, thereby leaving the active device areas 501 populated with active device molecules while clearing other device areas. After rinsing, substrates may be returned to thermal processing unit 607 for drying.

Figure 8:
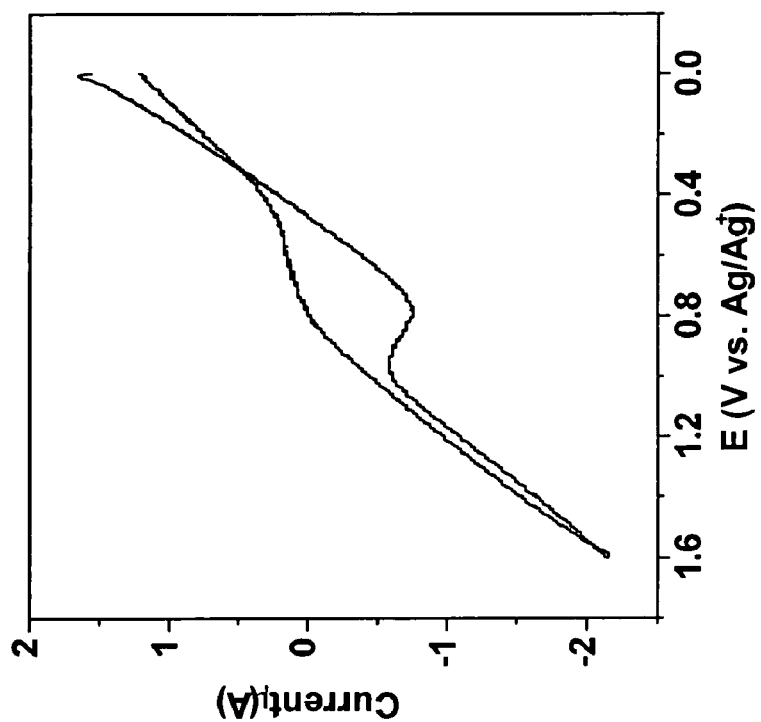
FIG. 8 illustrates an electrical characteristic of a processing defect represented by FIG. 7.
Figure 7:
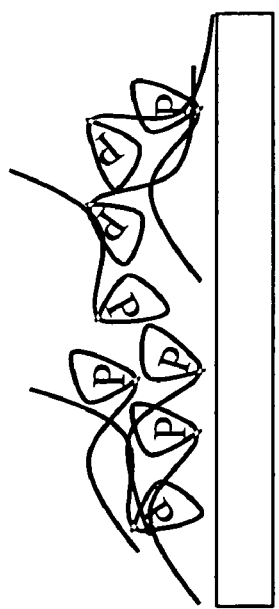
FIG. 7 shows a visual representation of a processing defect.

Optionally, one or more metrology modules 613 may be included to evaluate the quality of the attached active device molecules. Metrology module 613 may involve visual observation and qualification of processed substrates, or may include electrical characterization of processed substrates. As shown in FIG. 7, poorly attached active device molecules exhibit poor alignment, distribution, and attachment. While these features are difficult to observe visually, they are electrically apparent. FIG. 8 shows the electrical characteristics of a poorly attached sample. By comparison of FIG. 8 with FIG. 3, for example, it is apparent that poor attachment is readily detectible. In many cases this type of metrology can be used to detect process aberrations before the substrates have exited the processing tool. It may be desirable to incorporate a rework module (not shown) that will strip off the poorly attached molecules and reactivate the surface of the active areas 501 of a malformed substrate. In this manner, unacceptable process variations and failures can be detected and corrected automatically or semi-automatically before the substrates have been removed from the processing tool.

Processed substrates are removed from the processing tool via load module 601. Once the self-assembly chemistry is completed the substrates are less sensitive to contamination, however, it may be desirable to place substrates in an environmentally controlled carrier for transport to subsequent process locations.

The attachment process tool in FIG. 6 illustrates both single wafer process modules (e.g., coater 603 and rinser 609) as well as batch process modules (e.g. thermal processing 607). It is contemplated that various processes may be implemented as batch processes even within an integrated environment. Single-substrate processing offers some benefits with respect to process control, however, batch processing tends to be less expensive.

To complete a chemical cell, a gel-like electrolyte material is applied to the substrate surface over the attached active device molecules. A tool depicted in FIG. 9 can be used either in-line with the molecule application tool (shown in FIG. 6), or as a standalone tool, depending on process throughput and floor space considerations. Gels used in these types of processes are similar in composition and consistency to photoresists. Therefore, photoresist application tools can be adapted to apply an electrolyte gel thickness on the order of one micron (or even substantially thicker or thinner), bake it and transfer it to the next step in the process.

Figure 9:
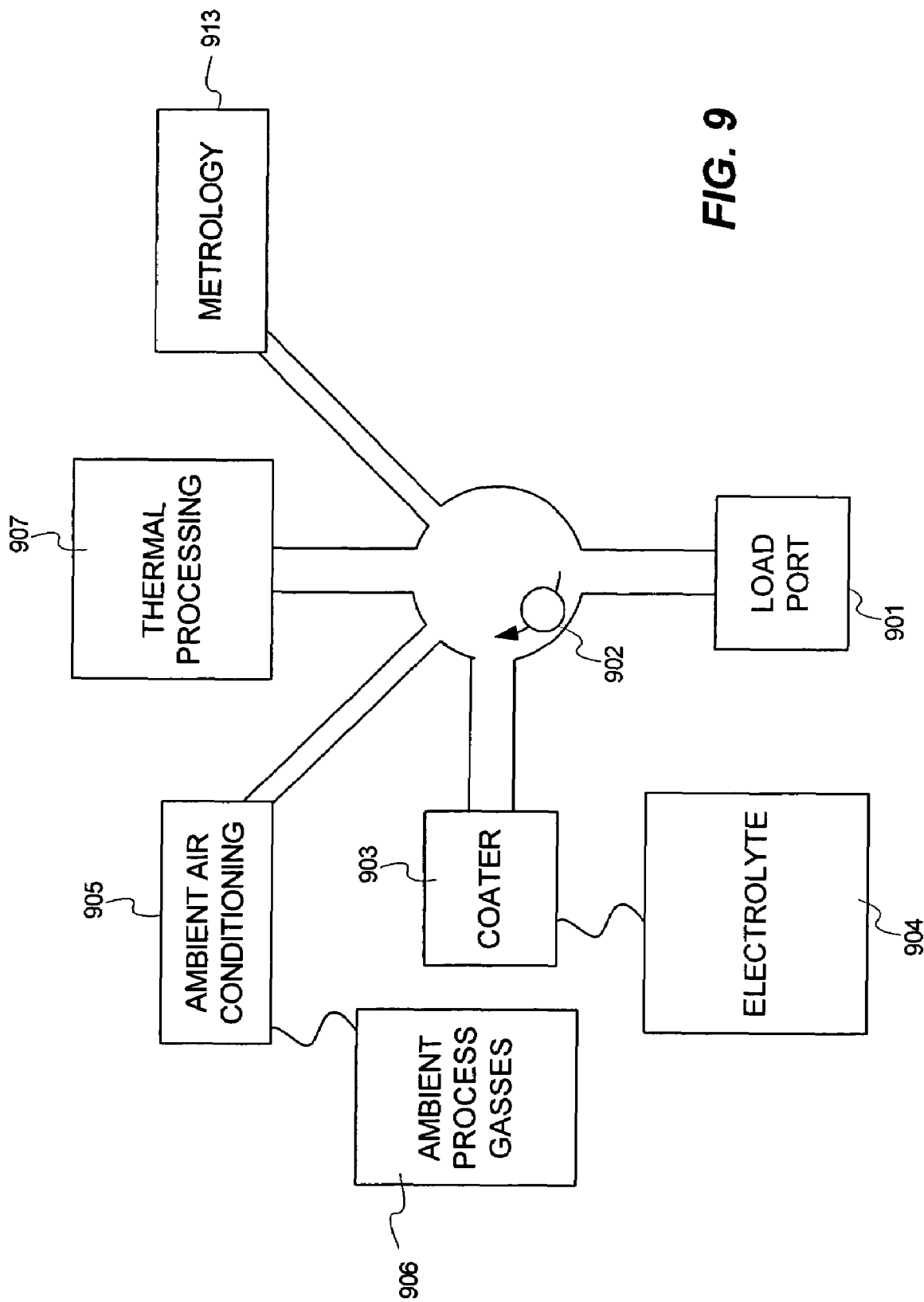
FIG. 9 schematically illustrates a gel electrolyte formation processing tool in accordance with the present invention.

FIG. 9 illustrates an electrolyte formation tool which would be typically used subsequent to the attachment tool shown in FIG. 6. Alternatively, the tool shown in FIG. 9 is integrated with the tool in FIG. 6 or coupled to the tool shown in FIG. 6 so that substrates can be automatically transferred (e.g., by robotic transfer mechanisms) between the tools. Electrolyte formation involves application of a conformal layer of electrolyte solution or gel to cover the active device molecules. The electrolyte supply 904 is maintained in an environmentally controlled storage container so that it can be delivered through coater 903 with consistent temperature, concentration and uniformity. Example materials that are suitable electrolytes include polyethylene oxide, propylene carbonate and the like. Spin speed and spin speed profile of coater 903 are adjusted based on the viscosity and flow characteristics of the electrolyte to provide suitable coverage for a particular application.

Transfer mechanism 902 moves substrates from coater 903 to thermal processing module 907 which comprises, for example, hot plates, convection heating, microwave heating, or other suitable controlled thermal mechanisms for heating and/or cooling the substrates. Thermal processing is used to drive off solvents or carrier liquids to increase viscosity of the gel electrolyte. Thermal processing may also polymerize or partially polymerize the gel electrolyte to improve mechanical stability in certain applications. Thermal processing may be performed in the ambient atmosphere provided by ambient air conditioning 905, or alternatively provided by ambient process gasses supplied directly to thermal processing module 907. A typical thermal treatment cycle would involve soaking the substrates at 65 degrees Celsius for about one minute.

Optionally, metrology unit 913 may be used to physically, optically, or electronically characterize partially processed substrates while they remain in the protected environment of the electrolyte formation tool shown in FIG. 9. Tests performed by metrology unit 913 can be similar to those performed by metrology unit 613 described in reference to FIG. 6. Integrated rework units (not shown) may be included to rework product determined to be unacceptable by metrology unit 613.

Figure 10:
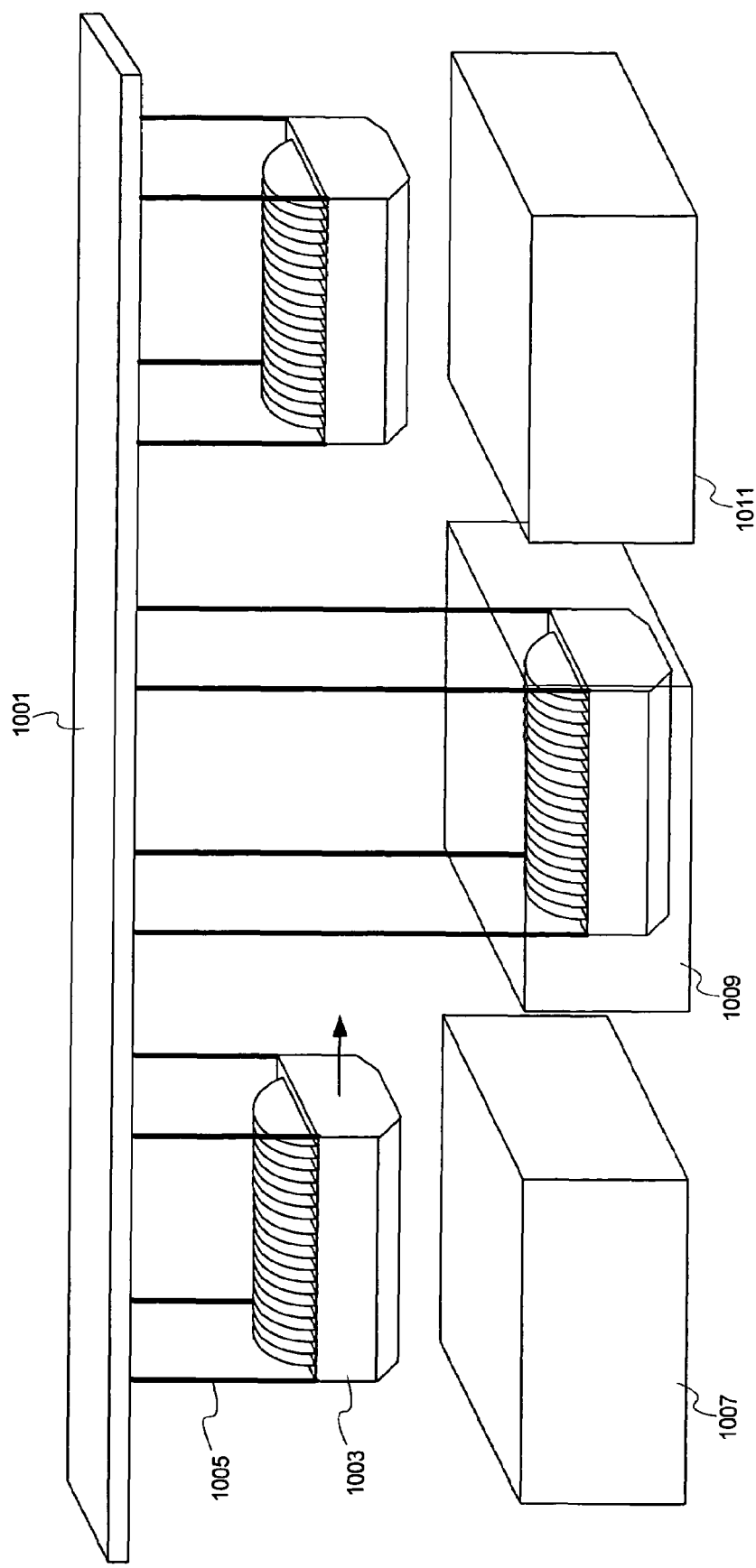
FIG. 10 illustrates a portion of a batch processing tool in accordance with an embodiment of the present invention.

FIG. 10 shows a schematic of a batch processing tool in accordance with the present invention. Batch processing techniques process multiple substrates at the same time and tend to have cost advantages over single-wafer processes. For example, production tools that are designed to rinse 25 to 100 substrates (or more) at a time in large tanks or spray rinsers are modified to be used as a large reaction vessel for the attachment of molecules. Thus, a large tank full of a solution containing active device molecules can be prepared and maintained at an appropriate temperature, and a large number of wafers would be processed at the same time. These automatic tools have the advantage of in-line wafer cleaning and drying stations capability.

In FIG. 10, a robotic transfer mechanism comprising an overhead track 1001 loads and transfers wafers from the inline cassette (not shown) to a fluorocarbon polymer carrier 1003 (or other inert carrier) designed to be used in contact with solvent or aqueous solution. As many as 100 wafers can be loaded at a time in large production tools, although smaller capacity such as 25-wafer batches are desirable in many applications.

A robot arm 1005 transports carriers 1003 and lowers it into a temperature controlled inert tank 1007 filled with a solution of the molecules. The boat 1003 and wafers are then left in the tank for a predetermined length of time sufficient for the completion of the attachment chemical reactions. At that time, the robotic arm 1005 lifts the carrier 1003 and transfers the carrier 1003 to rinse tank 1009. Rinse tank 1009 is filled with solvent or other suitable reagent to facilitate the removal of molecules not attached to the surface. Typically, rinse tank 1009 can be agitated or stirred with bubbling inert gas or ultrasonic energy. After a suitable time, the robotic arm 1005 lifts up the boat again and transfers it to a final rinse tank 1011. Final rinse 1011 comprises a solvent or other suitable reagent rinse in the particular example and may be followed by air or nitrogen drying to reduce contamination.

Batch processing has some potential negative characteristics. First, from the contamination point of view, it is easy to contaminate the entire wafer load if unwanted chemicals or other contaminants are inadvertently introduced into any tank. Also, an environmental containment system that controls ambient atmosphere should be provided around all of the process stations and transport mechanism, which can be expensive to create and difficult to maintain as compared to single-substrate systems. Given the expected surface concentration of active charge sites, this contamination level would not have to be large. In addition, valuable and expensive chemicals may attach on the backside of the wafer as well as trapped on the boat or cassette. This can happen if for instance, the specific attachment tether is chemically active on the surface that wafer-processing leaves on the back side of wafers in the production run (oxides, nitrides etc) of materials that are used in current production line tools (quartz).

Very few molecules in solution actually wind up attached to the active area surface in a finished device. Consider that saturation coverage of even the smallest active device molecules currently being used for molecular device manufacturing occupy roughly $1 \times 10^{14}$ molecules per square centimeter of surface area, and the fact that saturation concentration in solution is roughly 50 millimolar. In a particular example of a single wafer tool, assuming each substrate requires 5 ml of molecule solution, there is approximately 250 mg of molecule applied to an 8" wafer. Yet $1 \times 10^{14}$ molecules per square centimeter implies that nanograms of material are actually attached to the surface. Hence, a large quantity of potentially useful active device molecules are rinsed away in the subsequent cleaning steps.

In the batch tool case, the potential for waste is more dramatic. Assuming the same solubility of the solution, a typical 30 liter tank would contain approximately 1.5 kilograms of molecules. It would require many hundreds of thousands of wafers processed through this tank to even approach gram quantity of depletion, let alone kilograms. It is more likely that contamination in the tank would make the solution worthless before depleting this quantity of material.

Thus, it is valuable in both single-substrate and batch process tools to incorporate a method to recover the solution after molecular attachment to the surface and rework the solutions to make them usable for further processing on subsequent wafers. As part of this recycling effort, chemical purification methods to ensure high quality and non-competing chemical reactions to the surface of attachments have already been developed and are being scaled to required volumes for high scale manufacturing. Thus, a simple collection strategy on these tools, say effluent collection on the spinner single wafer tool or tank storage of used solution in the bulk process tools, can be used. The collected solutions are sent back to the laboratory for purification, re-dissolution of the molecules to the correct solution concentration, and quality assurance programs (purity, ionic strength, etc.) are used for process control and reproducibility considerations.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A method, comprising:
   forming a layer of storage molecules on a working electrode, wherein the working electrode is built on top of and electrically coupled to an electrode of a transistor in a partially processed semiconductor wafer that includes a plurality of transistors with respective electrodes;
   attaching some of the storage molecules to the working electrode;
   removing unattached storage molecules; and
   applying an electrolyte to the working electrode over the attached storage molecules.

2. The method of claim 1, wherein the working electrode is comprised of aluminum, gold, silver, tungsten, titanium nitride or polysilicon.

3. The method of claim 2, wherein the working electrode is oxidized to form an oxide layer.

4. The method of claim 1, wherein the attaching is done with a self-assembling process.

5. The method of claim 1, wherein at least some of the attached storage molecules are aligned on the working electrode surface.

6. The method of claim 1, wherein the attaching is done in a dehumidified environment.

7. The method of claim 1, wherein the storage molecules are monomeric porphyrins, ferrocene-derivatized porphyrins, wing-shaped trimeric porphyrins, directly linked dimeric and trimeric porphyrins, or triple-decker sandwich porphyrins.

8. The method of claim 1, further comprising forming a reference electrode or counter electrode.

* * * * *